United States Patent [19]

Norishima et al.

[11] Patent Number: 5,436,097
[45] Date of Patent: Jul. 25, 1995

[54] MASK FOR EVALUATION OF ALIGNER AND METHOD OF EVALUATING ALIGNER USING THE SAME

[75] Inventors: Masayuki Norishima, Setagaya; Yoshiaki Toyoshima, Matsudo; Takeshi Matsunaga, Yokohama, all of Japan

[73] Assignee: Kabushiki Kaisha Toshiba, Kanagawa, Japan

[21] Appl. No.: 30,804

[22] Filed: Mar. 12, 1993

[30] Foreign Application Priority Data

Mar. 14, 1992 [JP] Japan ............... 4-089590

[51] Int. Cl.⁶ ............................ G03F 9/00
[52] U.S. Cl. ................................ 430/5; 430/22; 430/321; 355/45; 355/132; 355/125
[58] Field of Search ............. 430/5, 22, 269, 321; 355/133, 132, 125, 45, 43

[56] References Cited

U.S. PATENT DOCUMENTS 4,475,811 10/1984 Brunner ..................... 355/133
4,619,524 10/1986 Tabarelli et al. ............. 355/53

FOREIGN PATENT DOCUMENTS 25404 1/1990 Japan.
262043 2/1990 Japan.

*Primary Examiner*—S. Rosasco
*Attorney, Agent, or Firm*—Spensley Horn Jubas & Lubitz

[57] ABSTRACT

A mask for evaluation of an aligner includes, on a transparent substrate, a plurality of resistance measurement pattern blocks each including a plurality of resistance measurement patterns which have shapes identical to each other. Resistance values of respective measurement patterns of conductive film portions on a substrate exposed and formed by using a mask having a plurality of the same measurement patterns vary in dependency upon the accuracy of a lens, etc. of the aligner. Accordingly, this evaluation mask is used to carry out exposure process to etch a conductive film to measure resistance values of the conductive film portions to compare them to each other, thereby making it possible to carry evaluation of an aligner including evaluation of a lens therefor.

24 Claims, 7 Drawing Sheets

5,436,097

MASK FOR EVALUATION OF ALIGNER AND METHOD OF EVALUATING ALIGNER USING THE SAME

BACKGROUND OF THE INVENTION

1. Field of the Invention

This invention relates to a mask for evaluation of an aligner used in a manufacturing process of a semiconductor device, and a method of evaluating an aligner using the same, and more particularly to an evaluation mask or an evaluation method preferably applicable for evaluation of an optical system of an aligner.

2. Description of the Prior Art

In the process for manufacturing a semiconductor device such as IC or LSI, etc., a lithographic process is an important process for forming various circuit patterns on a semiconductor substrate, or forming mask patterns used for ion implantation or diffusion.

FIG. 1 is a schematic cross sectional view of an aligner for lithography called a stepper (stepping projection aligner). Such a stepper is popularly used at present, and serves to repeatedly step a wafer with respect to a projection image of a pattern of a glass mask called a reticle to carry out exposure process. In this stepper, there is used a reticle serving as a glass mask 11 on which a pattern magnified so that its size is about five times larger than that of a pattern to be formed is provided as a chromium pattern, etc. Ultraviolet rays 12 from a lamp 15 are condensed by using a condensing unit 16 and focuses by using a focusing lens 17 to allow the rays thus focused to be incident to a reduction lens unit 13 through the reticle 11 to reduce them by the reduction lens unit 13 to project a mask image onto a photosensitive material such as photo resist coated on a substrate such as a semiconductor substrate, etc. And by exposing the rays on a photo resist (hereinafter simply referred to as a resist) film while stepping the substrate with respect to the projected mask image, a resist mask pattern is thereby formed.

Since the accuracy of a resist mask pattern formed by such lithographic process affects the accuracy of all patterns of a semiconductor device manufactured, the accuracy of the aligner is required to be severely controlled.

Particularly, since recent semiconductor devices are required to have larger capacity or higher integration, miniaturization of patterns and an enlargement in the exposure area, i.e., the chip size have been developed, so the accuracy required for an aligner or a lens therefore has become more severe. Accordingly, it is required that a finer pattern can be processed with good accuracy, and its processing accuracy is uniform in a broader exposure area.

In order to satisfy such requirements for the aligner, with respect to an aligner introduced into respective manufacturing lines, evaluation of lens accuracy, etc. is carried out at the time of introduction thereof and regularly. As the evaluation method, there is ordinarily used an evaluation pattern in which multi-directional standard calibration patterns are arranged at predetermined positions such as the central portion or the peripheral portion, etc. in an exposure area to allow those patterns to be exposed to light by various exposure times or focuses to compare those dimensions to carry out evaluation. At present, for the dimensional measurement, a high resolution Scanning Electron Microscopy (high resolution SEM) for measurement is used. In addition, in order to carry out control of dimensions of products actually manufactured, there has been also carried out a method of monitoring the dimension of a predetermined pattern of a product subject to exposure process at all times by measurement by the high resolution SEM to provide feedback of changes in the dimension upon occasion to adjust the exposure condition.

However, the dimensional measurement by the high resolution SEM has, in the first place, the drawback that a time required for one measurement is relatively long by focus adjustment of the high resolution SEM, etc. In addition, in order to carry out dimensional measurement with good accuracy, if an attempt is made to completely carry out positional alignment with respect to a pattern to be subjected to dimensional measurement, a manual adjustment by a person who carries out measurement is required. As a result, it is difficult to carry out automatic measurement. Accordingly, there is a limitation in an increase in the measurement point or the measurement period. Particularly, in evaluating curvature or aberration, etc. of a lens, dimensional comparisons at positions as many as possible within an exposure area are required. In accordance with measurement by the high resolution SEM, however, sufficient measurement is unable to be carried out when throughput of the line is taken into consideration. Further, with respect to patterns used in products, patterns at respective positions within an exposure area are generally different from each other. As a result, it is difficult to monitor changes in the processing dimension by curvature or aberration, etc. of a lens.

In addition, it is important for carrying out dimensional management to carry out not only lens evaluation, i. e., evaluation within an exposure area, but also obtain gross data of dimensions of wafer in-plane or respective lots to monitor changes in the deviation thereof. In the case of measurement by the high resolution SEM, because of restriction of throughput, etc., it is impossible to obtain gross data which can tolerate statistical evaluation such as deviation of measured values.

SUMMARY OF THE INVENTION

Accordingly, an object of this invention is to provide a mask for evaluation of an aligner, which has improved evaluation accuracy of an aligner, particularly improved efficiency and accuracy in carrying out accuracy evaluation or dimensional management of a lens, and capable of obtaining gross data in a short time thus to carry out statistical evaluation.

Another object of this invention is to provide a method of evaluating an aligner using an evaluation mask for an aligner as mentioned above.

According to one aspect of the present invention, there is provided a mask for evaluation of an aligner comprising:

a transparent substrate; and an exposure mask pattern having a plurality of resistance measurement pattern blocks each including a plurality of resistance measurement patterns which are formed on said transparent substrate, and have shapes identical to each other.

According to another aspect of the present invention, there is provided a method of evaluating an aligner, comprising the steps of:

mounting, onto the aligner to be evaluated, an exposure mask provided with a plurality of resistance measurement pattern blocks each including a plurality of resistance measurement patterns which have shapes identical to each other on a transparent substrate, allowing a photo-resist coated on a substrate to be exposed to light and to be subjected to developing process by using said aligner, thus to form a photo-resist mask pattern, etching a conductive film formed on said substrate with said photo-resist mask pattern being as a mask, thus to form the conductive film provided with a pattern comprised of a plurality of resistance measurement pattern blocks each including a plurality of resistance measurement patterns.

measuring resistance values of said plurality of resistance measurement patterns of said conductive film to determine resistance values within said respective resistance measurement pattern blocks, and comparing measured resistance values with respect to said respective measurement pattern blocks to thereby evaluate the characteristic of said aligner.

In accordance with this invention, an aligner evaluation mask formed on a transparent substrate has a plurality of resistance measurement pattern blocks each having identical pattern configuration, and the resistance measurement pattern blocks are arranged in the same direction or have predetermined angles relative to the neighboring blocks. Therefore, when this mask is used to carry out exposure, it becomes possible to correctly evaluate accuracy (including accuracy of the lens system) of the aligner by comparing resistance values of resistance measurement patterns of etched conductive film portions. Namely, since resistance values of respective measurement patterns each comprised of a conductive film on a substrate exposed to light and formed by using a mask having a plurality of the same measurement patterns vary depending on accuracy of a lens, etc. of the aligner, these resistance values are compared with each other, thereby making it possible to evaluate a lens for an aligner, etc.

DESCRIPTION OF THE PREFERRED EMBODIMENTS

Preferred embodiments of this invention will now be described with reference to the attached drawings.

Figure 1:
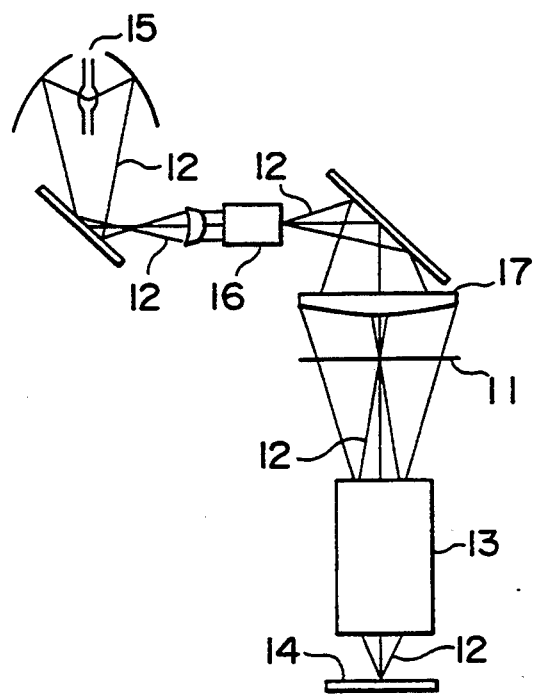
FIG. 1 is conceptual view showing the structure of an aligner (stepper) for lithography conventionally used.
Figure 2:
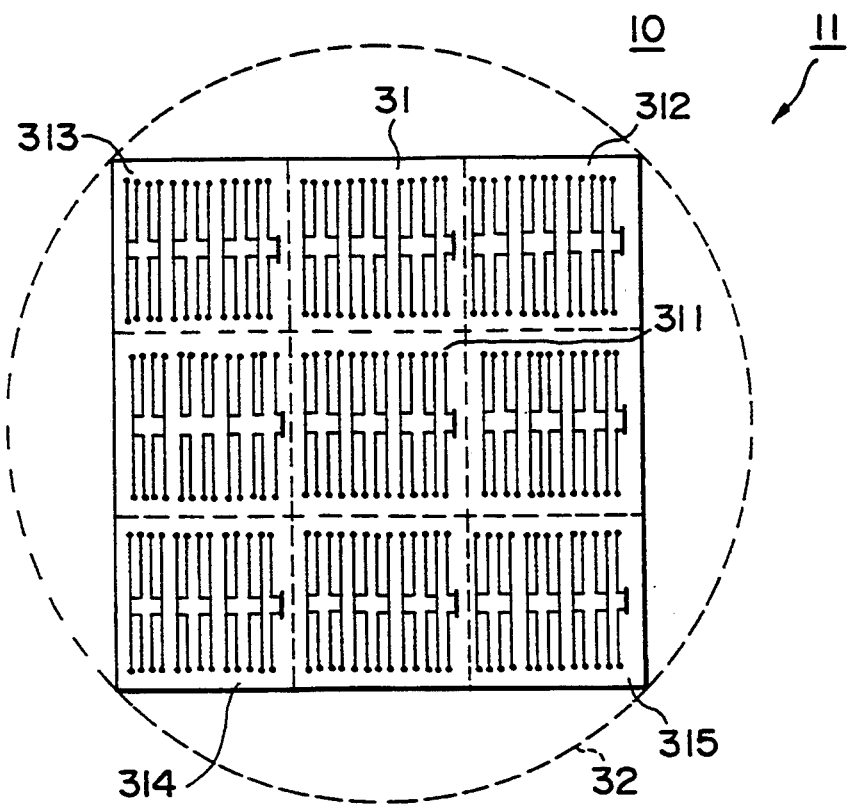
FIG. 2 is a plan view of an exposure area of an aligner to which a mask pattern of an aligner evaluation mask according to this invention is projected.

Initially, a first embodiment will be described with reference to FIGS. 2 to 5. FIG. 2 is a plan view showing a mask pattern of a reticle projected in a maxmimum exposure area 32 of an aligner to be evaluated, FIG. 3 is a plan view showing a resistance measurement pattern blocks constituting a mask pattern of a reticle, FIG. 4 is a plan view showing a resistance measurement pattern of a conductive film on a substrate formed by using a reticle, and FIGS. 5A to 5F are partial cross sectional views of a conductive film on a substrate formed by using a reticle.

In the reticle 11 shown in fIG. 2, a plurality of resistance measurement pattern blocks 31 (hereinafter referred to as a sub-chip) are formed as a chromium film on a transparent substrate 10 such as a glass, etc. In this embodiment, nine sub-chips are formed.

Figure 3:
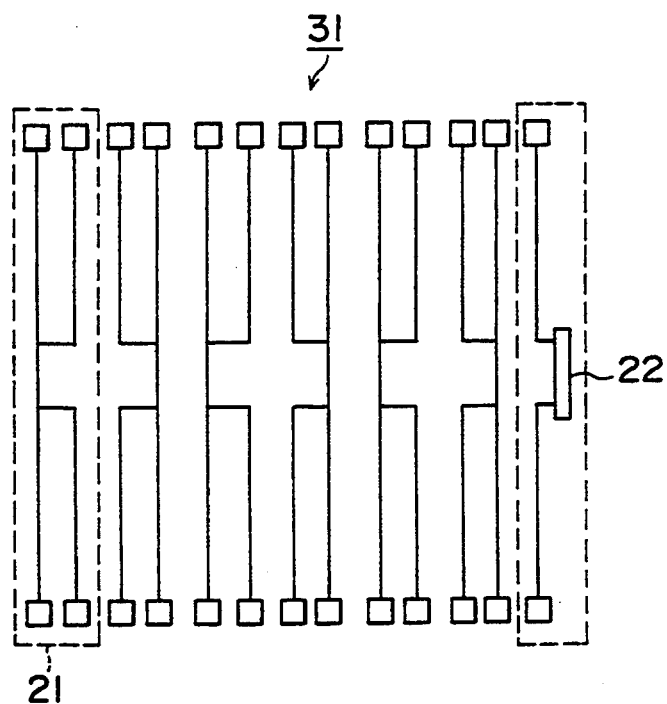
FIG. 3 is a plan view of a sub-chip of a mask pattern of an exposure mask according to a first embodiment of this invention.

FIG. 3 shows the detail of one of sub-chips. Each sub-chip is formed of a plurality of resistance measurement patterns 21 and a single sheet resistance measurement pattern 22.

Figure 4:
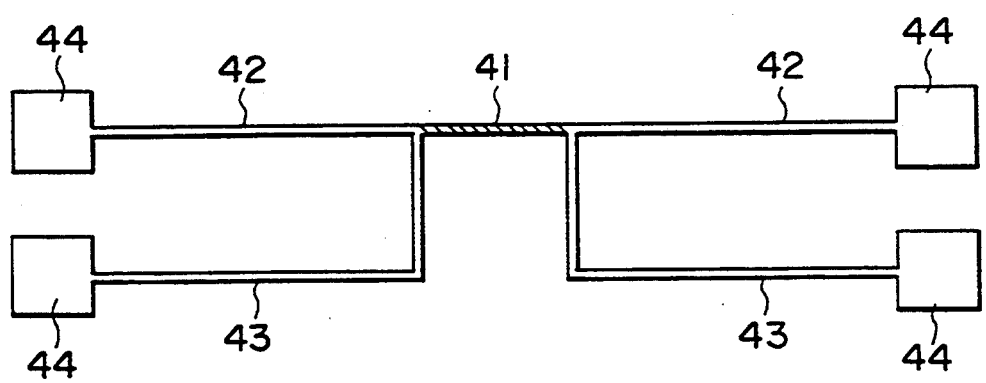
FIG. 4 is a schematic plan view of a four-terminal resistance measurement pattern.

The detail of the resistance measurement pattern 21 is shown in FIG 4. This resistance measurement pattern 21 is formed as a four-terminal Kelvin method resistance measurement pattern formed with a single layer which can measure resistance with good precision in the most stable manner. This resistance measurement pattern 21 includes a portion 41 to be subjected to resistance measurement (hereinafter referred to as a portion 41 under resistance measurement), current/voltage application wiring 42 formed on the extension thereof, voltage monitoring wirings 43 branched from the connecting portions of the portion 41 under resistance measurement and the current/voltage application wirings 42 and arranged in parallel with the current/voltage application wirings 42, and probing pads 44 provided at the end portions of respective wirings. By allowing a constant current to flow between pads, the resistance value of the portion 41 under resistance measurement is measured. Further, the sheet resistance measurement pattern 22 is fundamentally formed as a four-terminal resistance measurement pattern wherein the size (dimension) of the resistance measured portion is caused to be sufficiently large so that a change in dimension from a value in design by exposure which will be described later can be neglected.

It is to be noted that while, in this embodiment, a pattern based on the Kelvin method suitable for resistance measurement of a conductive film was used as the resistance measurement pattern 21, any pattern based on existing other methods may be used.

Figure 5A:
FIGS. 5A to 5F are cross sectional views of a substrate every process step showing the process for forming resistance measurement patterns using an aligner evaluation mask according to this invention, respectively.
Figure 5B:
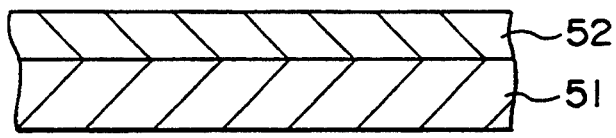
Figure 5C:
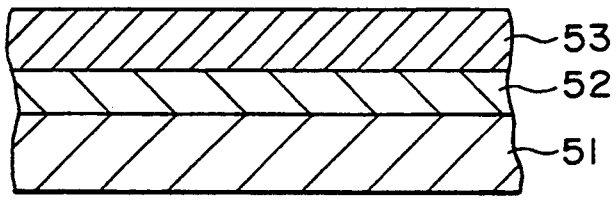
Figure 5D:
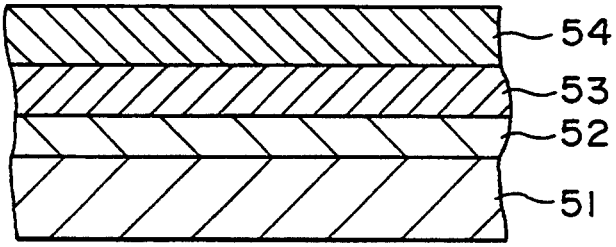

A method of forming a conductive film having four-terminal resistance measurement pattern on a substrate such as a silicon semiconductor, etc. by using the reticle 11 and a stepper in which the reticle is mounted will now be described. A silicon oxide film 52 having a thickness of about 10–400 nm is formed (FIG. 5B) by thermal oxidation on a silicon semiconductor substrate 51 (FIG. 5A) used as a substrate, thus to provide insulation between the semiconductor substrate 51 and a conductive film 53 which will be referred to soon. Conductive film 53 comprised of polycrystalline silicon having a thickness of about 40 nm is deposited by CVD method on the silicon oxide film 52 (FIG. 5C) to further diffuse phosphorus thereinto by the vapor phase diffusion. In addition, a resist 54 is coated thereon by the spin coating method, etc. (FIG. 5D).

Figure 5E:
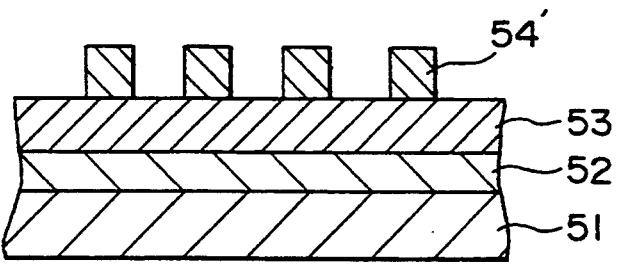

Then, the stepper in which reticle 11 is mounted is used to implement an exposure process to the resist. At this time, as shown in FIG. 2, an image of a mask pattern of the reticle is projected so that it is inscribed in a maximum exposure area 32 of the aligner to be evaluated. The exposed resist is developed, resulting in the state where only portions 54' corresponding to portions to be a conductive pattern remain (FIG. 5E).

Figure 5F:
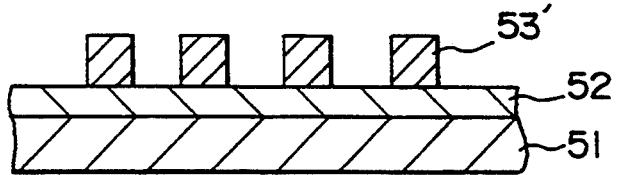

Subsequently, with the developed resist being as an etching mask, polycrystalline silicon film 53 is etched to form a pattern having remaining portions 53' corresponding to the mask pattern of the reticle by anisotropic etching such as RIE, etc. (FIG. 5F). As the result of the fact that the mask pattern of the reticle 11 is transferred, a plurality of sub-chips are included in the pattern formed. Within the sub-chips, four-terminal resistance measurement patterns and sheet resistance measurement patterns of the polycrystalline silicon within respective sub-chips are to be included.

The fact that the number of sub-chips is great and their positions are scattered or distributed in carrying out exposure process makes it possible to precisely carry out evaluation of the aligner in a manner to include the influence of curvature or aberration of lens.

In this embodiment, the dimension of the sub-chip 31 of the mask pattern to be projected is 5 mm×5 mm. Since an aligner having an exposure area having a diameter of 21.5 mm used in the manufacturing line at present can take a square area of 15 mm×15 mm at the maximum within the exposure area, an image of a mask pattern having nine sub-chips is projected as shown in FIG. 2. If a pattern dimension within the central sub-chip 311 and pattern dimensions within respective sub-chips 312, 313, 314 and 315 at the peripheral portion of the nine sub-chips are compared with each other, it is possible to monitor curvature or aberration, etc. of a lens provided within the aligner to be evaluated. Since the central portion of the lens is the area where curvature or aberration is minimum, it is also possible to evaluate other areas by considering the central portion as a standard area, but to further relatively evaluate respective areas by making comparison between data in all areas.

When a image of a mask pattern is projected in this way, conductive films having four-terminal resistance measurement pattern reflecting features such as curvature or aberration, etc. of a lens provided within the evaluated aligner are formed. This dimensional difference of each measurement pattern can be more precisely evaluated according as the number of sub-chips formed becomes larger.

The lens evaluation of the aligner which has carried out lithography can be carried out by electrically measuring resistance values of a plurality of four-terminal resistance measurement patterns of the conductive film 53 formed by utilizing the reticle by using the kelvin four-terminal method to compare resistance values of respective patterns or dimensions obtained by a simple calculation from those resistance values with respect to the respective sub-chips.

Actual resistance measurement and dimensional measurement are carried out by allowing a constant current (I) of about 10 mA to flow in the portion 41 under resistance measurement caused to be through the current/voltage application wirings 42 shown in FIG. 4 to determine a voltage drop (V) at the portion 41 under resistance measurement by a voltage measurement caused to be through respective voltage monitoring wirings 43 to determine a resistance value (R) from the formula expressed as $R=V/I$. In the case of this embodiment, the length of the resistance measured portion 41 is 100 $\mu$m in design, and the width thereof is 0.5 $\mu$m in design. When such a dimension is employed, a resistance value measured is the order of about K. ohms, and is a value such that it can be measured with good accuracy by the electric measurement. Further, there is the possibility that because of deviation in wafer in-plane of a film thickness of polycrystalline silicon or wafer in-plane of phosphorous diffusion, the sheet resistance value of the conductive film itself of the polycrystalline silicon may vary depending upon the position. However, it is possible to calibrate such deviation by measuring sheet resistance values ($\rho$) by using the sheet resistance measurement patterns 22 provided in respective sub-chips. Actually, a resistance (R) to be measured is expressed as $R=\rho\times L/W$ by using a sheet resistance ($\rho$) and a length (L) and a width (W) of the portion 41 under resistance measurement which are obtained by measurement within the same sub-chip. Here, since the length (L) is caused to be sufficiently long, there is no problem when such length is employed as a value in design (100 $\mu$m in this embodiment), the finished dimensional width (W) is calculated from the formula expressed as $W=(\rho/R)\times L$.

In the case where the evaluation system for a semiconductor manufacturing apparatus is used, the dimensional measurement is carried out by an electric measurement. For this reason, an automatic measurement using an automatic prober can be carried out. As a result, it is possible to obtain gross data in a far short time as compared to the high resolution SEM. Since the evaluation pattern can be formed by one layer, the preparation time therefor can be maintained short, and it can be said that there is hardly an increase in time until a result is provided from the start of evaluation as compared to the conventional method. Moreover, while since the dimension of the sub-chip is 5 mm×5 mm in this embodiment, there is taken a form such that nine sub-chips are arranged within the exposure area, the dimension of the sub-chip can be further reduced. If the dimension of sub-chip is reduced, it is possible to increase the number of divisions in an exposure area, for example, like 16 sub-chips or 25 sub-chips. In carrying out a uniformity evaluation of a lens in a finer range, subdivision of the exposure area corresponding to a necessary accuracy can be carried out. It is to be noted that it is sufficient to vary the dimension of a measured pattern, particularly its width in dependency upon the size (dimension) of a product subjected to exposure at the time of actual manufacturing by using an aligner to be evaluated.

While, in this embodiment, polycrystalline silicon in which phosphoric diffusion was carried out is used as the conductive film 53 of the evaluation pattern, as long as the resistance value of a portion under resistance measurement fails within the range measured with good accuracy by an electric measurement in a pattern size necessary for evaluation, there may be used, as an evaluation pattern formation material, any conductive material such as metal, metal silicide or impurity implanted silicon, etc. Here, the reason why polycrystalline silicon is used as the conductive film is that material of the conductive film and material of the gate within a MOS semiconductor device formed by this semiconductor manufacturing apparatus are caused to be the same. If materials of the both components are caused to be the same in this way, a conductive film can be formed under the same condition as that of gate formation of a product. Accordingly, evaluation in conformity with actual circumstances of a product can be carried out.

Accordingly, using a conductive material utilized in the manufacturing process of an actual product is advantageous in this invention. For example, as the gate material, there may be utilized polycide in which a silicide film of refractory metal such as tungsten, molybdenum or titanium, etc. is formed on a polycrystalline silicon film. Further, an aluminum conductive film which is the same material as that of wiring of a semiconductor device may be used for this purpose. In addition, a conductive film comprised of a metal thin film such as relatively thin tungsten or molybdenum, etc. may be used irrespective of a material of an actual product. Since the film thickness is thin in this example, a dimensional difference between a resist pattern and a conductive pattern formed can be reduced, advantageously resulting in the fact that evaluation can be carried out with an accuracy closer to the lens accuracy of the evaluated aligner.

Figure 6:
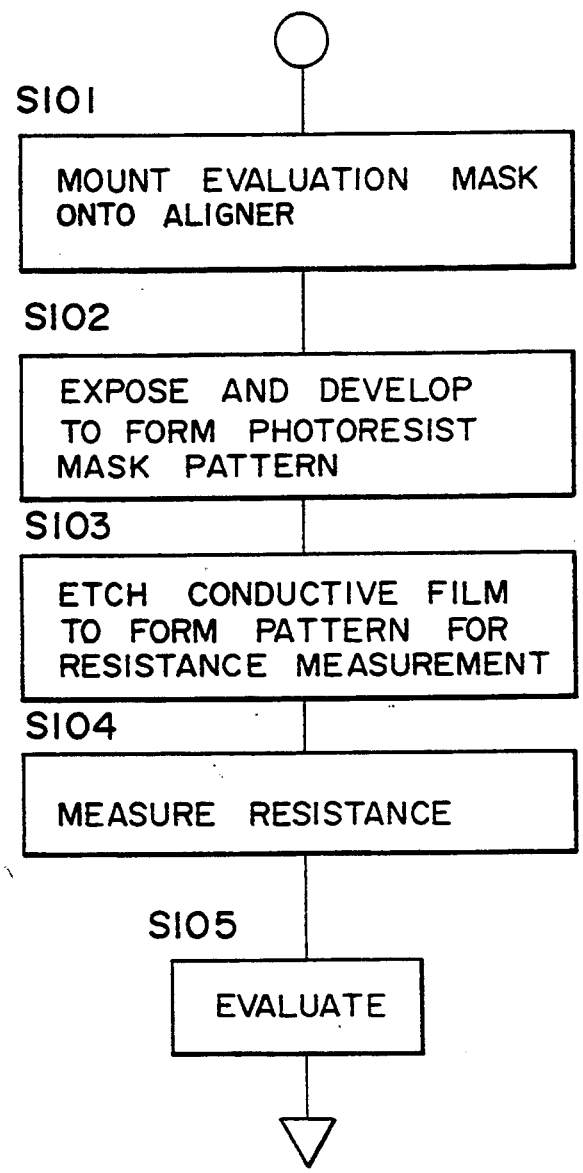
FIG. 6 is a flowchart showing an aligner evaluation method according to this invention.

An evaluation method for an aligner according to this invention will now be described with reference to the flowchart of FIG. 6 collectively shown.

First, an aligner evaluation mask (reticle) having, as mask patterns, nine sub-chips comprised of a plurality of resistance measurement patterns is mounted onto an aligner (stepper) (step S101). This aligner is used to allow a photo resist coated on a polycrystalline silicon conductive film on a semiconductor substrate to be exposed to light. The exposed substrate is subjected to development process, thus to form a photo resist mask pattern (step S102).

This polycrystalline silicon conductive film is etched using the developed photo resist mask pattern as a mask, thus to form a conductive film having a conductive pattern constituted with nine sub-chips comprised of a plurality of resistance measurement patterns (step S103).

The resistance values of the resistance measurement patterns comprised of the conductive film are measured to determine resistance values of patterns within respective sub-chips (step S104).

By comparing resistance values of corresponding patterns with respect to respective sub-chips, the aligner is evaluated (step S105). Further, the resistance values of respective patterns within sub-chips are calibrated by suitably measuring sheet resistance values. The lens of the aligner is precisely and rapidly evaluated by these procedures.

It is to be noted that while a semiconductor substrate on which conductive films are to be formed exists only for evaluation, integrated circuits, etc. assembled into a semiconductor device are formed on other large number of semiconductor substrates. Exposure is carried out plural times by the aligner on the semiconductor substrate where conductive films are to be formed to form a plurality of conductive films thereon. Further, the compared results of the resistance values may be calibrated by comparing the characteristics of these conductive films, thereby making it possible to allow the evaluation to be more accurate. However, several conductive films may be formed at a margin portion, for example, of a semiconductor substrate where a semiconductor device is to be actually formed to evaluate the lens, etc. of an aligner used in manufacturing of the semiconductor device.

Figure 7:
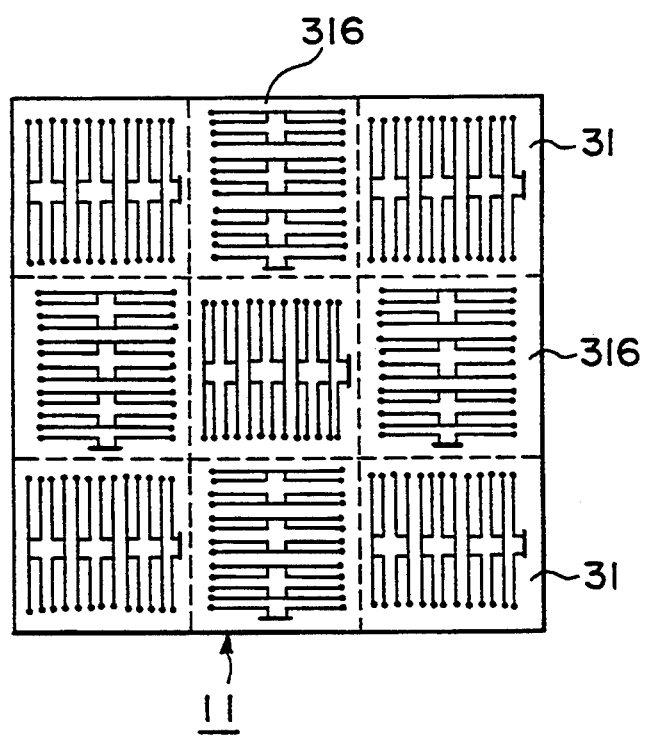
FIG. 7 is a plan view of a mask pattern of an exposure mask according to a second embodiment of this invention.
Figure 8:
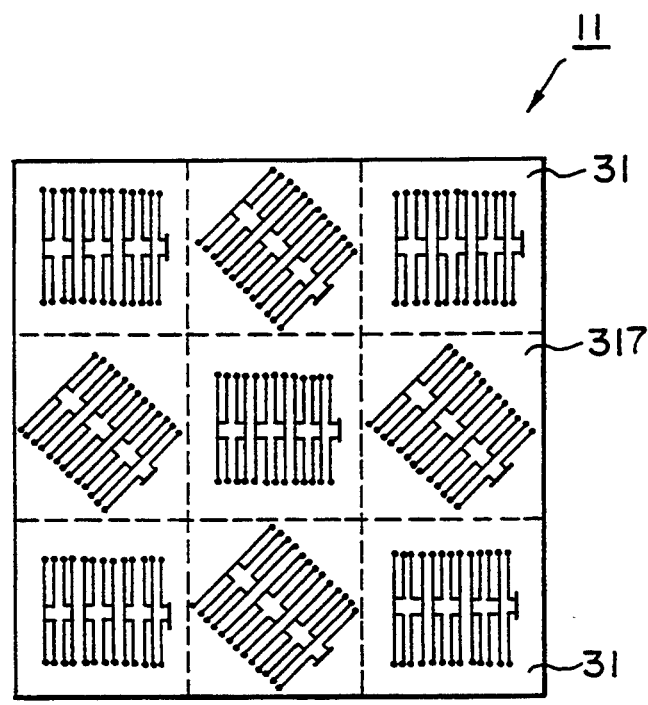
FIG. 8 is a plan view of a mask pattern of an exposure mask according to a third embodiment of this invention.

A second embodiment will now be described with reference to FIGS. 7 and 8. These figures are both plan views showing a mask pattern of the reticle 11, respectively. These examples are characterized in that arrangement directions of sub-chips 31 of the mask pattern is alternately changed relative to directions of neighboring chips. While sub-chips 316 each of which arrangement direction is changed by 90 degrees is used in FIG. 7, sub-chips 317 each of which arrangement direction is changed by 45 degrees as shown in FIG. 8 may be used. In the case of this angle, it is necessary to allow pattern sizes of the sub-chips 31, 317 to be smaller to some extent than those of the areas of the respective sub-chips. While the pattern of the sub-chip is inclined in a right direction, it may be inclined by 45 degrees in a left direction. By varying the arrangement direction of a portion or portions of the sub-chips in this way, it is possible to monitor not only the evaluation of curvature or aberration, etc. depending upon the position within the lens, but also its directional dependency. With respect to the pattern within the sub-chip, the pattern of the first embodiment may be applied, or any one of patterns of third and fourth embodiments which will be described later may be applied.

Figure 9:
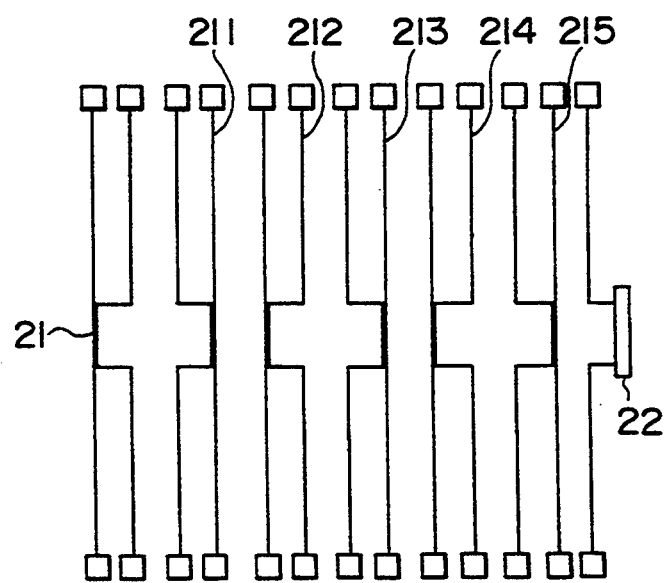
FIG. 9 is a plan view of a sub-chip in an exposure mask according to the third embodiment of this invention.

A third embodiment will now be described with reference to FIGS. 9 and 10. FIG. 9 is a plan view of a sub-chip constituting a mask pattern of the reticle. This sub-chip is characterized in that widths of portions under resistance measurement at the central portions of respective four-terminal resistance measurement patterns 21, 211, 212, 213, 214, 215 within the sub-chip 31 of this mask pattern are different from each other.

In general, at a resolution in the vicinity of the maximum resolution, deviation of a pattern dimension and/or dimensional deviation within the exposure area become large. In this respect, by employing an approach as described above, it is possible to evaluate, by gross data, maximum resolution dimension of an aligner to be evaluated or the dimensional dependency of the lens characteristic. With respect to the method of arrangement of the sub-chip, any one of methods of the first and second embodiments may be employed.

Figure 10:
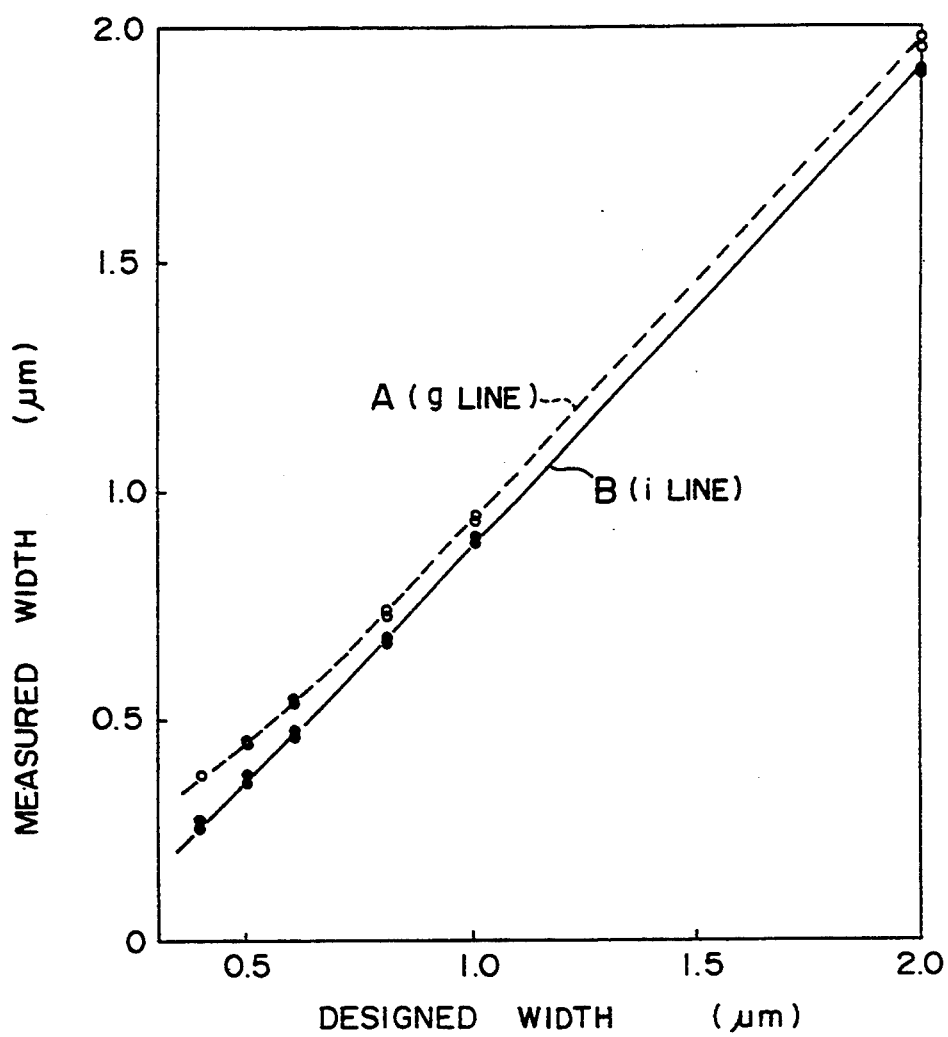
FIG. 10 is a characteristic diagram showing the relationship between designed widths and measured widths of a conductive film.

FIG. 10 is a characteristic diagram showing the relationship between the measurement width (finish width) and the width in design. In this diagram, the ordinate indicates a width ($\mu$m) of the portion 41 under resistance measurement of a measured conductive film, and the abscissa indicates a width in design, i.e., dimension of the width ($\mu$m) of a portion under resistance measurement within a resistance measurement pattern of a mask pattern which will be obtained if an image of a reticle is precisely projected by the aligner.

As shown in FIG. 10, the measurement width and width in design must have primarily a proportional relationship as indicated by a linear line, but are affected by the lens characteristic or the size of the pattern, etc., giving rise to deviation of the width of conductive films to be formed. Particularly, the influence by the pattern width is great. In the case where a g-line (wavelength: 436 nm) is used in the aligner, there takes place deviation in the width of the design width from a value in the vicinity if 0.8 μm as indicated by the curve A. On the other hand, in the case where i-line (wavelength: 365 nm) deviation of the width of the design width takes place from a width in the vicinity of 0.5 μm as indicated by the curve B. For this reason, implementation of evaluation by gross data of dimensions at respective points within the exposure area corresponding to the exposure time or the focus to management of dimension becomes more important. In accordance with the evaluation method by the conventional high resolution SEM, evaluation of dimension deviation with respect to the exposure condition at respective points within the exposure area with respect to patterns of different dimensions are substantially impossible. Such evaluation can be attained for the first time by this invention.

Figure 11:
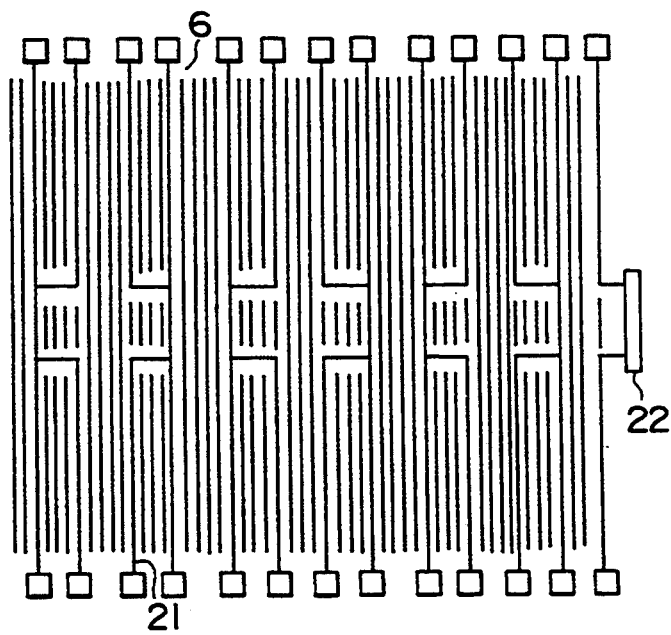
FIG. 11 is a plan view of a sub-chip of an exposure mask according to a fourth embodiment of this invention.

A fourth embodiment will now be described with reference to FIG. 11. FIG. 11 is plan view on a sub-chip constituting a mask pattern of the reticle. This sub-chip 31 includes a plurality of four-terminal resistance measurement pattern 21 groups and a sheet resistance measurement pattern 22. Between respective patterns, various line and space patterns 6 are inserted as a dummy pattern. By inserting such dummy patterns, the pattern density at the time of exposure is changed. In the lithographic process, there is empirically known a loading effect such that even if the pattern exposure of the same dimension is carried out under the same condition, the dimension of a resist pattern formed varies in accordance with the pattern density of a mask used. A set of reticles of which pattern densities are changed by respectively inserting dummy patterns shown in this embodiment are prepared to carry out exposure process at the same timing by using an aligner to be evaluated to carry out a systematical analysis of gross data, thereby making it possible to carry out trend analysis of the loading effect in a short period. With respect to the method of arrangement of sub-chips, any one of arrangement methods in the first and second embodiments may be employed.

It is to be noted that mask patterns in respective embodiments may be suitably combined. For example, the mask pattern shown in the third embodiment and the mask pattern shown in the fourth embodiment may be combined.

As described above, in accordance with this invention, a reticle having a plurality of resistance measurement patterns is used to carry out exposure process and electric measurement, thereby making it possible to dramatically improve the accuracy evaluation of the aligner, particularly the accuracy and the efficiency in carrying out the accuracy evaluation or the dimensional management of lens for the aligner as compared to the evaluation by the high resolution SEM conventionally carried out. In addition, acquisition of gross data relating to the aligner accuracy in a short time which could not be substantially carried out in view of the throughput with the conventional method, and the statistical evaluation based thereon can be carried out.

What is claimed is:

1. A method of evaluating an aligner, comprising the steps of:
   mounting, onto the aligner to be evaluated, an exposure mask provided with a plurality of resistance measurement pattern blocks each including a plurality of resistance measurement patterns, wherein said plurality of resistance measurement pattern blocks have identical configurations and wherein said resistance measurement patterns in at least two adjacent resistance measurement pattern blocks are arranged to have different angular relationships therebetween;
   allowing photo-resist coated on a substrate to be exposed to light and to be subjected to a developing process using said aligner, thus to form a photo-resist mask pattern,
   etching a conductive film formed on said substrate with said photo-resist mask pattern being used as a mask, thus to form the conductive film into a pattern comprised of a plurality of resistance measurement pattern blocks each including a plurality of resistance measurement patterns,
   measuring resistance values of said plurality of resistance measurement patterns of said conductive film to determine resistance values within said respective resistance measurement pattern blocks, and
   comparing a first measured resistance value corresponding to a first measurement pattern block with a second measured resistance value corresponding to a second measurement pattern block to thereby evaluate the accuracy of said aligner.

2. An evaluation method for an aligner as set forth in claim 1, wherein said conductive film is selected from a group of a polycrystalline silicon film, a polycide film, an aluminum film, and a metal thin film.

3. An evaluation method for an aligner as set forth in claim 1, wherein the step for determining said resistance values is carried out by using the four-terminal kelvin method.

4. A mask for evaluation of an aligner comprising:
   a transparent substrate; and
   an exposure mask pattern having a plurality of resistance measurement pattern blocks each including a plurality of resistance measurement patterns which are formed on said transparent substrate, all pattern configurations of said plurality of resistance measurement pattern blocks being identical;
   said plurality of resistance measurement patterns in said plurality of resistance measurement pattern blocks being all arranged in the same direction within said mask, said plurality of resistance measurement pattern blocks being arranged on said mask so as to substantially cover an exposure area of said aligner so as to detect aligner aberration over a substantial portion of said exposure area of said aligner.

5. An evaluation mask as set forth in claim 4, wherein said resistance measurement pattern has a portion to be subjected to resistance measurement, the width of at least a portion of said portion to be subjected to resistance measurement being different from the width of the remaining portions in the resistance measurement pattern block.

6. An evaluation mask as set forth in claim 4, wherein dummy patterns are formed within said resistance measurement pattern blocks.

7. An evaluation mask as set forth in claim 4, wherein a sheet resistance measurement pattern is provided within said resistance measurement pattern block.

8. A mask for evaluation of an aligner comprising:
   a transparent substrate; and
   an exposure mask pattern having a plurality of resistance measurement pattern blocks each including a plurality of resistance measurement patterns which are formed on said transparent substrate, all pattern configuration of said plurality of resistance measurement pattern blocks being identical, said plurality of resistance measurement patterns in said plurality of resistance measurement blocks being arranged so that said resistance measurement patterns in neighboring blocks have different arrangement angles to evaluate variations in aligner accuracy.

9. An evaluation mask as set forth in claim 8, wherein said different arrangement angle is 45 degrees or 90 degrees relative to the direction in which said other resistance measurement pattern blocks are arranged.

10. An evaluation mask as set forth in claim 8, wherein at least one of said resistance measurement patterns within a given one of said resistance measurement pattern blocks has a portion to be subjected to a resistance measurement, wherein the width of at least a portion of said portion to be subjected to a resistance measurement is different from the width of a corresponding portion of at least one other of said resistance measurement patterns within said one of said resistance measurement pattern blocks.

11. An evaluation mask as set forth in claim 8, wherein dummy patterns are formed within said resistance measurement pattern blocks.

12. An evaluation mask as set forth in claim 8, wherein a sheet resistance measurement pattern is provided within a plurality of said resistance measurement pattern blocks.

13. A mask for evaluation of an aligner comprising:
a transparent substrate; and
an exposure mask pattern having a plurality of resistance measurement pattern blocks each including a plurality of resistance measurement patterns which are formed on said transparent substrate, wherein said resistance measurement patterns are disposed at a plurality of locations within said exposure mask pattern so that said exposure mask pattern can be used in evaluating the uniformity of aligner performance, wherein at least one of said resistance measurement pattern blocks includes a pattern structure having sufficient density to induce a loading effect in said aligner.

14. The mask of claim 13 wherein said plurality of resistance measurement patterns include four terminal resistance patterns.

15. The mask of claim 14 wherein said plurality of resistance measurement patterns are formed from a single layer of said conductive film.

16. The mask of claim 15 wherein said plurality of resistance measurement patterns are configured to perform a Kelvin-type resistance measurement.

17. The mask of claim 14 wherein said four terminal resistance patterns have a resistivity on the order of about one thousand ohms.

18. A method of evaluating an aligner, comprising the steps of:
mounting, onto the aligner to be evaluated, an exposure mask formed on a transparent substrate provided with a plurality of resistance measurement pattern blocks each including a plurality of resistance measurement patterns which have shapes identical to each other, wherein said plurality of resistance measurement pattern blocks are distributed over a substantial portion of an available exposure area of the aligner;
exposing photo-resist coated on a substrate to light using said aligner and developing said photo-resist to form a photo-resist mask pattern;
etching a conductive film formed on said substrate with said photo-resist mask pattern being used as a mask, thus to form the conductive film into a pattern of a plurality of resistance measurement pattern blocks each including a plurality of resistance measurement patterns; and
measuring resistance values of at least a plurality of said resistance measurement patterns formed from said conductive film to determine resistance values within said respective resistance measurement pattern blocks, and comparing resistance values measured in different respective resistance measurement pattern blocks to thereby evaluate the uniformity of aligner performance.

19. The method of claim 18 wherein said step of measuring resistance values comprises the steps of applying a current between two terminals of said resistance measurement pattern and measuring a voltage between two terminals of said resistance measurement pattern.

20. The method of claim 19 wherein said current terminals of said resistance measurement pattern are different from said voltage terminals of said resistance measurement pattern.

21. The method of claim 18 further comprising the step of comparing a central resistance value measured for a resistance measurement pattern corresponding to a central portion of said mask with a peripheral resistance value measured for a resistance measurement pattern corresponding to a peripheral portion of said mask.

22. The method of claim 21 further comprising the steps of measuring a sheet resistance value for a position corresponding to a central portion of said mask and measuring a sheet resistance value for a position corresponding to a peripheral portion of said mask.

23. The method of claim 18 wherein said conductive film is doped polysilicon.

24. The method of claim 21 wherein said mask is used to form a plurality of resistance test patterns under different aligner exposure conditions.

* * * * *